US010290533B2

(12) United States Patent

Usenko

(10) Patent No.: US 10,290,533 B2

(45) Date of Patent: May 14, 2019

(54) THERMALLY STABLE CHARGE TRAPPING LAYER FOR USE IN MANUFACTURE OF SEMICONDUCTOR-ON-INSULATOR STRUCTURES

(71) Applicant: SunEdison Semiconductor Limited (UEN201334164H), Singapore (SG)

(72) Inventor: Alex Usenko, Lake St. Louis, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 34 days.

(21) Appl. No.: 15/557,503

(22) PCT Filed: Mar. 11, 2016

(86) PCT No.: PCT/US2016/022089

§ 371 (c)(1),
(2) Date: Sep. 12, 2017

(87) PCT Pub. No.: WO2016/149113

PCT Pub. Date: Sep. 22, 2016

(65) Prior Publication Data

US 2018/0047614 A1 Feb. 15, 2018

Related U.S. Application Data

(60) Provisional application No. 62/134,179, filed on Mar. 17, 2015.

(51) Int. Cl.

| | |
|---|---|
| ***H01L 21/762*** | (2006.01) |
| ***H01L 27/12*** | (2006.01) |
| ***H01L 21/02*** | (2006.01) |

(52) U.S. Cl.

CPC ...... *H01L 21/7627* (2013.01); *H01L 21/0203* (2013.01); *H01L 21/02238* (2013.01);

(Continued)

(58) Field of Classification Search

None

See application file for complete search history.

(56) References Cited

U.S. PATENT DOCUMENTS

| | | | |
|---|---|---|---|
| 4,501,060 | A | 2/1985 | Frye et al. |
| 4,755,865 | A | 7/1988 | Wilson et al. |

(Continued)

FOREIGN PATENT DOCUMENTS

| | | | |
|---|---|---|---|
| EP | 0939430 | A2 | 1/1999 |
| EP | 0926709 | A2 | 6/1999 |

(Continued)

OTHER PUBLICATIONS

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.

(Continued)

*Primary Examiner* — Su C Kim

*Assistant Examiner* — David S Wilbert

(74) *Attorney, Agent, or Firm* — Armstrong Teasdale LLP

(57) ABSTRACT

A single crystal semiconductor handle substrate for use in the manufacture of semiconductor-on-insulator (e.g., silicon-on-insulator (SOI)) structure is etched to form a porous layer in the front surface region of the wafer. The etched region is oxidized and then filled with a semiconductor material, which may be polycrystalline or amorphous. The surface is polished to render it bondable to a semiconductor donor substrate. Layer transfer is performed over the polished surface thus creating semiconductor-on-insulator (e.g., silicon-on-insulator (SOI)) structure having 4 layers: the handle substrate, the composite layer comprising filled pores, a dielectric layer (e.g., buried oxide), and a device layer. The structure can be used as initial substrate in fabricating radiofrequency chips. The resulting chips have (Continued)

suppressed parasitic effects, particularly, no induced conductive channel below the buried oxide.

64 Claims, 4 Drawing Sheets

(52) U.S. Cl.
CPC .. *H01L 21/02258* (2013.01); *H01L 21/76254* (2013.01); *H01L 21/76286* (2013.01); *H01L 27/1203* (2013.01)

(56) References Cited

U.S. PATENT DOCUMENTS

| | | | |
|---|---|---|---|
| 4,968,384 | A | 11/1990 | Asano |
| 5,189,500 | A | 2/1993 | Kusunoki |
| 6,043,138 | A | 3/2000 | Ibok |
| 6,373,113 | B1 | 4/2002 | Gardner et al. |
| 6,465,045 | B1 | 10/2002 | Heuer et al. |
| 6,562,127 | B1 | 5/2003 | Kud et al. |
| 6,624,047 | B1 | 9/2003 | Sakaguchi et al. |
| 7,868,419 | B1 | 1/2011 | Kerr et al. |
| 7,879,699 | B2 | 2/2011 | Schulze et al. |
| 7,915,716 | B2 | 3/2011 | Pisigan et al. |
| 8,058,137 | B1 | 11/2011 | Or-Bach et al. |
| 8,076,750 | B1 | 12/2011 | Kerr et al. |
| 8,466,036 | B2 | 6/2013 | Brindle et al. |
| 8,481,405 | B2 | 7/2013 | Arriagada et al. |
| 8,796,116 | B2 | 8/2014 | Grabbe et al. |
| 8,846,493 | B2 | 9/2014 | Libbert et al. |
| 8,859,393 | B2 | 10/2014 | Ries et al. |
| 9,202,711 | B2 | 12/2015 | Liu et al. |
| 2002/0024152 | A1 | 2/2002 | Momoi et al. |
| 2002/0068419 | A1* | 6/2002 | Sakaguchi .......... H01L 21/2007 438/458 |
| 2002/0090758 | A1 | 7/2002 | Henley |
| 2003/0129780 | A1 | 7/2003 | Auberton-Herve |
| 2004/0002197 | A1 | 1/2004 | Fathimulla |
| 2004/0005740 | A1 | 1/2004 | Lochtefeld |
| 2004/0031979 | A1* | 2/2004 | Lochtefeld ........ H01L 21/76254 257/233 |
| 2004/0108537 | A1 | 6/2004 | Tiwari |
| 2005/0153524 | A1 | 7/2005 | Maa |
| 2005/0167002 | A1 | 8/2005 | Ghyselen |
| 2006/0030124 | A1 | 2/2006 | Maa |
| 2006/0033110 | A1 | 2/2006 | Alam |
| 2006/0076649 | A1 | 4/2006 | Letertre et al. |
| 2006/0226482 | A1 | 10/2006 | Suvorov |
| 2006/0270190 | A1 | 11/2006 | Nastasi et al. |
| 2007/0032040 | A1 | 2/2007 | Lederer |
| 2007/0054466 | A1 | 3/2007 | Hebras |
| 2008/0153251 | A1* | 6/2008 | Kostrzewa ........ H01L 21/76254 438/406 |
| 2008/0283916 | A1 | 11/2008 | Yamazaki |
| 2009/0004833 | A1 | 1/2009 | Suzuki |
| 2009/0014828 | A1 | 1/2009 | Mizushima |
| 2009/0092810 | A1 | 4/2009 | Lee |
| 2009/0321829 | A1 | 12/2009 | Nguyen |
| 2011/0174362 | A1 | 7/2011 | Tanner |
| 2011/0298083 | A1 | 12/2011 | Yoneda |
| 2012/0091587 | A1 | 4/2012 | Or-Bach |
| 2012/0161310 | A1 | 6/2012 | Brindle |
| 2012/0238070 | A1 | 9/2012 | Libbert |
| 2012/0267681 | A1 | 10/2012 | Nemoto |
| 2013/0120951 | A1 | 5/2013 | Zuo |
| 2013/0122672 | A1 | 5/2013 | Or-Bach |
| 2013/0168835 | A1 | 7/2013 | Botula |
| 2013/0193445 | A1 | 8/2013 | Dennard |
| 2013/0294038 | A1 | 11/2013 | Landru |
| 2013/0344680 | A1 | 12/2013 | Arriagada |
| 2014/0042598 | A1 | 2/2014 | Kitada |
| 2014/0070215 | A1 | 3/2014 | Bedell |
| 2014/0084290 | A1 | 3/2014 | Allibert |
| 2014/0120654 | A1 | 5/2014 | Fujii |
| 2014/0124902 | A1 | 5/2014 | Botula |
| 2014/0273405 | A1 | 9/2014 | Liu |
| 2015/0004778 | A1 | 1/2015 | Botula |
| 2015/0115480 | A1 | 4/2015 | Peidous |

FOREIGN PATENT DOCUMENTS

| | | | |
|---|---|---|---|
| EP | 1081748 | A2 | 3/2001 |
| EP | 1865551 | A1 | 12/2007 |
| EP | 2426701 | A1 | 7/2012 |
| EP | 2503592 | A1 | 9/2012 |
| JP | H01315144 | A | 12/1989 |
| JP | 2000150840 | A | 5/2000 |
| JP | 2007503726 | A | 2/2007 |
| JP | 2012099848 | A | 5/2012 |
| JP | 2012164906 | A | 8/2012 |
| JP | 2012253364 | A | 12/2012 |
| WO | 2009120407 | A2 | 10/2009 |
| WO | 2012127006 | A1 | 9/2012 |

OTHER PUBLICATIONS

Lederer, D. et al., Enhanced High resistivity SOI wafers for RF Applications, 2004, IEEE International SOI Conference, Oct. 2004, pp. 46-47.

Lederer, D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE International SOI Conference Proceedings, 2006, pp. 29-30.

Kerr, Daniel C., Identification of RF harmonic distortion of Si Substrates and its reduction using a trap-rich layer, IEEE (IEEE Topical Meeting), 2008, pp. 151-154.

Bucher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

Zamir, S. et al., Reduction of cracks in GaN films on Si-on-insulator by lateral confined epitaxy, Jounral of Crystal Growth, Elsevier Amsterdam, NL, Sep. 2002, pp. 375-380, vol. 243, No. 3-4.

Gao, Min, et al., A transmission electron microscopy study of microstructural defects in proton implanted silicon, Journal of Allied Physics, Oct. 15, 1996 American Institute of Physics, pp. 4767-4769, vol. 70, No. 8.

Gao, Min, et al., Two-dimensional network of dislocations and nanocavities in hydrogen-implanted and two-step annealed silicon, Applied Physics Letters, American Institute of Physics, May 18, 1998, pp. 2544-2546, vol. 72, No. 20.

International Search Report and Written Opinion of the International Search Authority regarding PCT/US2016/022089 dated May 27, 2016; pp. 1-14.

Office Action Summary issued for Japanese Application No. 2017-549081, dated Mar. 26, 2019 (2 pages).

* cited by examiner

THERMALLY STABLE CHARGE TRAPPING LAYER FOR USE IN MANUFACTURE OF SEMICONDUCTOR-ON-INSULATOR STRUCTURES

CROSS-REFERENCE TO RELATED APPLICATIONS

This application is a National Stage application of International Application No. PCT/US2016/022089, filed on Mar. 11, 2016. International Application No. PCT/US2016/019464 claims priority to U.S. Provisional patent application Ser. No. 62/134,179 filed on Mar. 17, 2015. The disclosure of which is hereby incorporated by reference in its entirety.

THE FIELD OF THE INVENTION

The present invention generally relates to the field of semiconductor wafer manufacture. More specifically, the present invention relates to a method of preparing a handle substrate for use in the manufacture of a semiconductor-on-insulator (e.g., silicon-on-insulator) structure, and more particularly to a method for producing a charge trapping layer in the handle wafer of the semiconductor-on-insulator structure.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, gallium arsenide, and other alloys of Group III and Group V elements, such as gallium nitride or indium phosphide, or alloys of Group II and Group IV elements, such as cadmium sulfide or zinc oxide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. Thick film device layers may have a device layer thickness between about 1.5 micrometers and about 20 micrometers. Thin film device layers may have a thickness between about 0.01 micrometer and about 0.20 micrometer. In general, composite layer structures, such as silicon-on-insulator (SOI), silicon-on-sapphire (SOS), and silicon-on-quartz, are produced by placing two wafers in intimate contact, thereby initiating bonding by van der Waal's forces, followed by a thermal treatment to strengthen the bond. The anneal may convert the terminal silanol groups to siloxane bonds between the two interfaces, thereby strengthening the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds or other contaminants, such as boron compounds, deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The surfaces of the wafers can be additionally chemically activated by a wet treatment, such as an SC1 clean or hydrofluoric acid. The wet treatment and the plasma activation may occur in either order, or the wafers may be subjected to only one treatment. The wafers are then pressed together, and a bond is formed there between. This bond is relatively weak, due to van der Waal's forces, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of cracks along the cleave plane, thus separating a portion of the donor wafer. The crack forms due to the formation of voids from the implanted ions, which grow by Ostwald ripening. The voids are filled with hydrogen and helium. The voids become platelets. The pressurized gases in the platelets propagate micro-cavities and micro-cracks, which weaken the silicon on the implant plane. If the anneal is stopped at the proper time, the weakened bonded wafer may be cleaved by a mechanical process. However, if the thermal treatment is continued for a longer duration and/or at a higher temperature, the micro-crack propagation reaches the level where all cracks merge along the cleave plane, thus separating a portion of the donor wafer. This method allows for better uniformity of the transferred layer and allows recycle of the donor wafer, but typically requires heating the implanted and bonded pair to temperatures approaching 500° C.

The use of high resistivity semiconductor-on-insulator (e.g., silicon-on-insulator) wafers for RF related devices such as antenna switches offers benefits over traditional substrates in terms of cost and integration. To reduce parasitic power loss and minimize harmonic distortion inherent when using conductive substrates for high frequency applications it is necessary, but not sufficient, to use substrate wafers with a high resistivity. Accordingly, the resistivity of the handle wafer for an RF device is generally greater than about 500 Ohm-cm. With reference now to FIG. 1, a silicon on insulator structure 2 comprising a very high resistivity silicon wafer 4, a buried oxide (BOX) layer 6, and a silicon device layer 10. Such a substrate is prone to formation of high conductivity charge inversion or accumulation layers 12 at the BOX/handle interface causing generation of free carriers (electrons or holes), which reduce the effective resistivity of the substrate and give rise to parasitic power losses and device nonlinearity when the devices are operated at RF frequencies. These inversion/accumulation layers can be due to BOX fixed charge, oxide trapped charge, interface trapped charge, and even DC bias applied to the devices themselves.

A method is required therefore to trap the charge in any induced inversion or accumulation layers so that the high resistivity of the substrate is maintained even in the very near surface region. It is known that charge trapping layers (CTL) between the high resistivity handle substrates and the buried oxide (BOX) may improve the performance of RF devices fabricated using SOI wafers. A number of methods have been suggested to form these high interface trap layers. For example, with reference now to FIG. 2, one of the method of creating a semiconductor-on-insulator 20 (e.g., a silicon-on-insulator, or SOI) with a CTL for RF device applications is based on depositing an undoped polycrystalline silicon film 28 on a silicon substrate having high resistivity 22 and then forming a stack of oxide 24 and top silicon layer 26 on it. A polycrystalline silicon layer 28 acts as a high defectivity layer between the silicon substrate 22 and the buried oxide layer 24. See FIG. 2, which depicts a polycrystalline silicon film for use as a charge trapping layer 28 between a high resistivity substrate 22 and the buried oxide layer 24 in a silicon-on-insulator structure 20. An alternative method is the implantation of heavy ions to create a near surface damage layer. Devices, such as radiofrequency devices, are built in the top silicon layer 26.

It has been shown in academic studies that the polycrystalline silicon layer in between of the oxide and substrate improves the device isolation, decreases transmission line losses and reduces harmonic distortions. See, for example: H. S. Gamble, et al. "Low-loss CPW lines on surface stabilized high resistivity silicon," *Microwave Guided Wave Lett.,* 9(10), pp. 395-397, 1999; D. Lederer, R. Lobet and J.-P. Raskin, "Enhanced high resistivity SOI wafers for RF applications," *IEEE Intl. SOI Conf*, pp. 46-47, 2004; D. Lederer and J.-P. Raskin, "New substrate passivation method dedicated to high resistivity SOI wafer fabrication with increased substrate resistivity," *IEEE Electron Device Letters*, vol. 26, no. 11, pp. 805-807, 2005; D. Lederer, B. Aspar, C. Laghaé and J.-P. Raskin, "Performance of RF passive structures and SOI MOSFETs transferred on a passivated HR SOI substrate," *IEEE International SOI Conference*, pp. 29-30, 2006; and Daniel C. Kerr et al. "Identification of RF harmonic distortion on Si substrates and its reduction using a trap-rich layer", Silicon Monolithic Integrated Circuits in RF Systems, 2008. SiRF 2008 (IEEE Topical Meeting), pp. 151-154, 2008.

The properties of polycrystalline silicon charge trapping layer depends upon the thermal treatments the semiconductor-on-insulator (e.g., silicon-on-insulator) receives. A problem that arises with these methods is that the defect density in the layer and interface tend to anneal out and become less effective at charge trapping as the wafers are subjected to the thermal processes required to make the wafers and build devices on them. Accordingly, the effectiveness of polycrystalline silicon CTL depends on the thermal treatments that SOI receives. In practice, the thermal budget of SOI fabrication and device processing is so high that the charge traps in conventional polycrystalline silicon are essentially eliminated. The charge trapping efficiency of these films becomes very poor.

SUMMARY OF THE INVENTION

In one aspect, the objective of this invention is to provide a method of manufacturing semiconductor-on-insulator (e.g., silicon-on-insulator) wafers with thermally stable charge trapping layers, which preserve the charge trapping effectiveness and significantly improve the performance of completed RF devices.

Briefly, the present invention is directed to a multilayer structure. The multilayer structure comprises a single crystal semiconductor handle substrate comprising two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, a front surface region having a depth, D, as measured from the front surface and toward the central plane, and a bulk region between the front and back surfaces of the single crystal semiconductor handle substrate, wherein the front surface region comprises pores, each of the pores comprising a bottom surface and a sidewall surface, and further wherein the pores are filled with an amorphous semiconductor material, a polycrystalline semiconductor material, or a semiconductor oxide; a dielectric layer in contact with the front surface of the single crystal semiconductor handle substrate; and a single crystal semiconductor device layer in contact with the dielectric layer.

The present invention is further directed to a method of forming a multilayer structure. The method comprises: contacting a front surface of a single crystal semiconductor handle substrate with an etching solution to thereby etch pores into a front surface region of the single crystal semiconductor handle substrate, wherein the single crystal semiconductor handle substrate comprises two major, generally parallel surfaces, one of which is the front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, the front surface region having a depth, D, as measured from the front surface and toward the central plane, and a bulk region between the front and back surfaces of the single crystal semiconductor handle substrate, wherein each of the pores comprises a bottom surface and a sidewall surface; oxidizing the bottom surface and the sidewall surface of each of the pores; filling each of the pores having the oxidized bottom surface and the oxidized sidewall surface with amorphous semiconductor material; polycrystalline semiconductor material, or a semiconductor oxide; and bonding a dielectric layer on a front surface of a single crystal semiconductor donor substrate to the front surface of the single crystal semiconductor handle substrate to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate.

Other objects and features of this invention will be in part apparent and in part pointed out hereinafter.

DETAILED DESCRIPTION OF THE EMBODIMENT(S) OF THE INVENTION

According to the present invention, a method is provided for producing a charge trapping layer on a single crystal semiconductor handle substrate, e.g., a single crystal semiconductor handle wafer, such as a single crystal silicon handle wafer. The single crystal semiconductor handle wafer comprising the charge trapping layer is useful in the production of a semiconductor-on-insulator (e.g., silicon-on-insulator) structure. According to the present invention, the charge trapping layer in the single crystal semiconductor handle wafer is formed at the region near the oxide interface. Advantageously, the method of the present invention provides a charge trapping layer that is stable against thermal processing, such as subsequent thermal process steps in the production of the semiconductor-on-insulator substrate and device manufacture.

Figure 1:
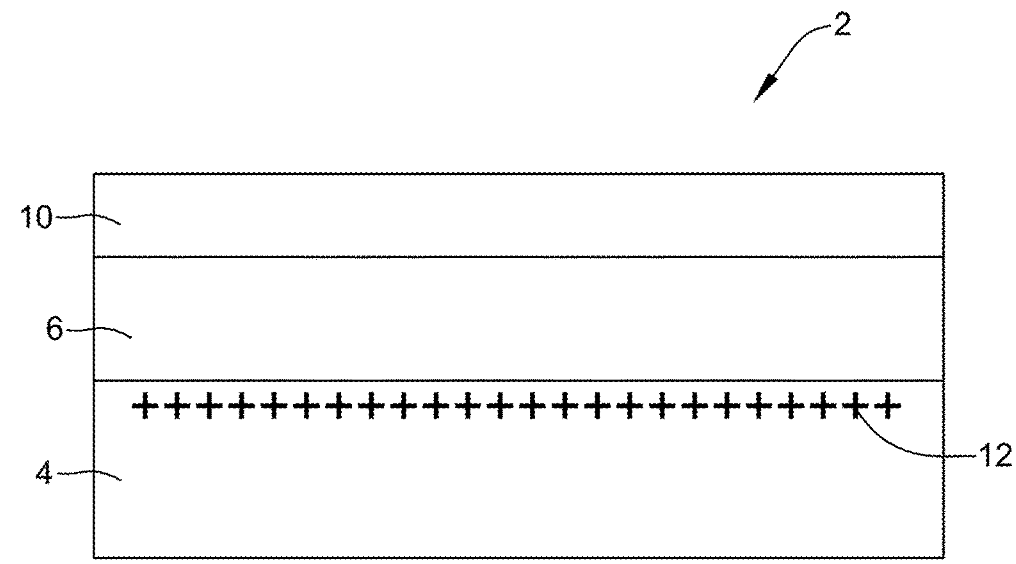
FIG. 1 is a depiction of a silicon-on-insulator wafer comprising a high resistivity substrate and a buried oxide layer.
Figure 2:
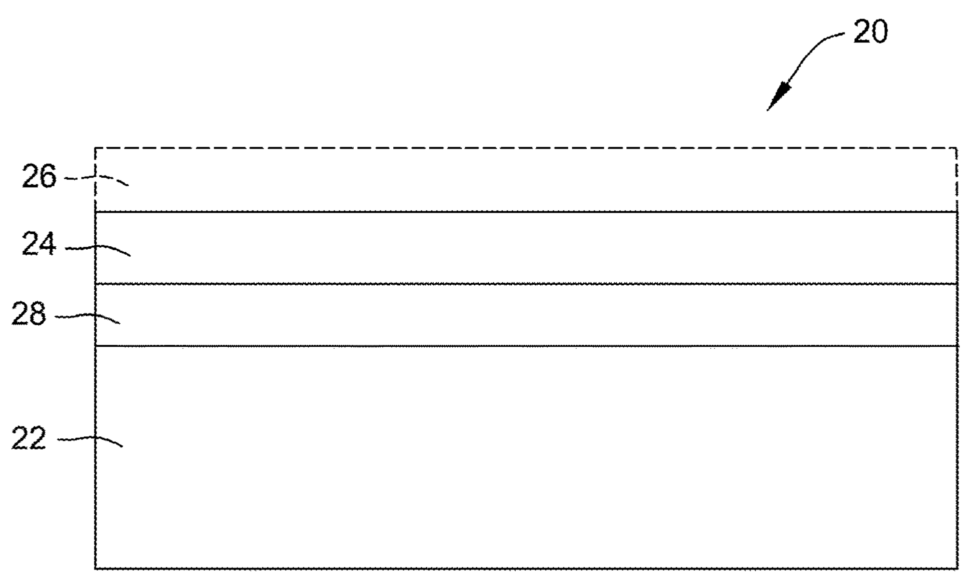
FIG. 2 is a depiction of a silicon-on-insulator wafer according to the prior art, the SOI wafer comprising a polycrystalline silicon charge trapping layer between a high resistivity substrate and a buried oxide layer.
Figure 3:
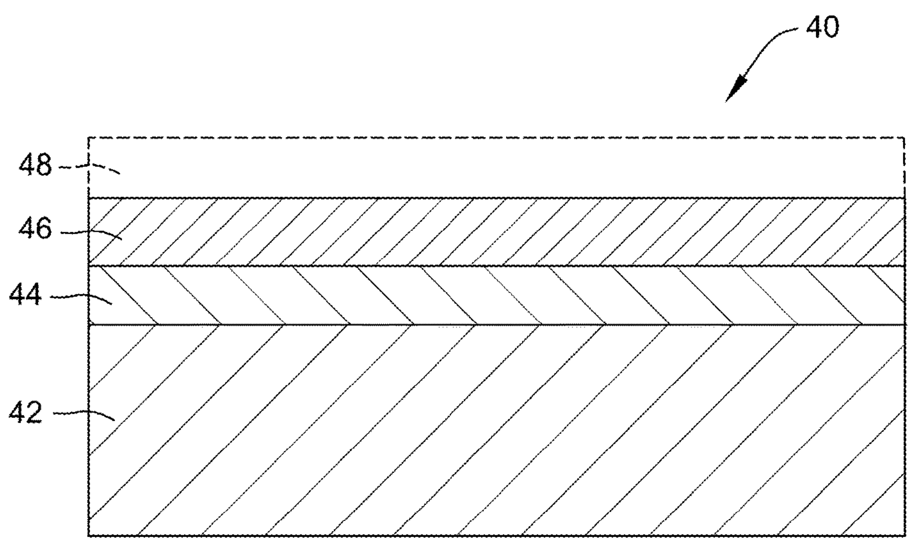
FIG. 3 is a depiction of a silicon-on-insulator wafer according to the present invention, the SOI wafer comprising a porous charge trapping layer between a high resistivity substrate and a buried oxide layer.

In some embodiments of the present invention, and with reference to FIG. 3, a single crystal semiconductor handle substrate 42 (i.e., a single crystal silicon handle substrate) is prepared for use in manufacture of a semiconductor-on-insulator (e.g., silicon-on-insulator) structure 40. In some embodiments, the single crystal semiconductor handle substrate 42 is etched to form a porous layer 44 in the front surface region of the substrate 42. The etching process increases the exposed surface area in the front surface region of the single crystal semiconductor handle substrate 42. In some embodiments, the single crystal semiconductor handle substrate 42 is electrochemically etched to form a porous layer in the front surface region of the substrate. Upon drying and exposure of the etched surface to an ambient atmosphere comprising oxygen (e.g., air), the exposed, etched surface of the porous film is oxidized. Exposure to air upon drying may be, in some embodiments, sufficient oxidation of the surfaces of the pores. In some embodiments, the pores may be anodically oxidized or thermally oxidized. In some embodiments, the etched porous region, optionally comprising an oxide film, is filled with semiconductor material. In some embodiments, the etched porous region, optionally comprising an oxide film, is filled with semiconductor material of the same type as the single crystal semiconductor handle substrate. In some embodiments, the single crystal semiconductor handle substrate comprises a single crystal silicon handle substrate, and the etched, porous region is filled with silicon. In some embodiments, polycrystalline silicon is deposited to fill pores in the porous layer. In some embodiments, amorphous silicon is deposited to fill pores in the porous layer. In some embodiments, the etched, porous region may be oxidized to thereby fill the pores with semiconductor oxide, e.g., silicon dioxide. The surface of the structure comprising the filled pores may be polished to make the surface bondable. For example, the filled structure may comprise an excess layer of fill material on the front surface of the single crystal semiconductor handle substrate. The excess layer of fill material may be polished to thereby render the front surface of the handle substrate bondable.

The resulting handle substrate 42 is suitable for use in the manufacture of a semiconductor-on-insulator (e.g., silicon-on-insulator) structure 40. Layer transfer is performed over the polished surface thus creating a semiconductor-on-insulator (e.g., silicon-on-insulator) structure 40 comprising the handle substrate 42, the composite layer comprising the filled pores 44, a dielectric layer 46 (e.g., buried oxide), and a single crystal semiconductor device layer 48 (e.g., a silicon layer derived from a single crystal silicon donor substrate). The semiconductor-on-insulator (e.g., silicon-on-insulator) structure 40 of the present invention may be used as an initial substrate in fabricating radiofrequency chips. Resulting chips have suppressed parasitic effects. In particular, a semiconductor-on-insulator (e.g., silicon-on-insulator) structure 40 comprising handle substrates 42 prepared according to the method of the present invention have no induced conductive channel below the buried oxide.

According to the method of the present invention, a composite film 44 in the front surface region of the single crystal semiconductor handle substrate 42 is obtained by fabricating a porous layer, oxidizing the exposed walls of the pores, and refilling the pores with deposited semiconductor (e.g., silicon) or by refilling the pores with semiconductor oxide (e.g., silicon dioxide). The resulting composite film 44 is suitable for use as a thermally stable trap rich layer in SOI wafer. The thermal stability is a fundamental difference between a regular polycrystalline silicon, which is a conventional charge trapping layer, and the composite film 44 in present invention. In this regard, annealing a structure comprising a conventional charge trapping layer, which may occur during subsequent thermal process steps, drives the system to a lower free energy state. When polycrystalline silicon is the charge trapping layer, there is energy associated with grain boundaries, which get minimized through minimizing area of the grain boundaries. This lowers the overall effectiveness of polycrystalline silicon as a charge trapping layer. When a composite film of the present invention is prepared as a charge trapping layer, the oxide walls divide the film into grains, and coarsening requires dissolving of the walls. This requires higher that 1100° C. temperatures. Accordingly, the composite film in the front surface region of the single crystal semiconductor handle substrate is thermally stable in the desired temperature range.

The substrates for use in the present invention include a semiconductor handle substrate, e.g., a single crystal semiconductor handle wafer and a semiconductor donor substrate, e.g., a single crystal semiconductor donor wafer. The semiconductor device layer 48 in a semiconductor-on-insulator composite structure 40 is derived from the single crystal semiconductor donor wafer. The semiconductor device layer 48 may be transferred onto the semiconductor handle substrate 42 by wafer thinning techniques such as etching a semiconductor donor substrate or by cleaving a semiconductor donor substrate comprising a damage plane. In general, the single crystal semiconductor handle wafer and single crystal semiconductor donor wafer comprise two major, generally parallel surfaces. One of the parallel surfaces is a front surface of the substrate, and the other parallel surface is a back surface of the substrate. The substrates comprise a circumferential edge joining the front and back surfaces, a bulk region between the front and back surfaces, and a central plane between the front and back surfaces. The substrates additionally comprise an imaginary central axis perpendicular to the central plane and a radial length that extends from the central axis to the circumferential edge. In addition, because semiconductor substrates, e.g., silicon wafers, typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

Prior to any operation as described herein, the front surface and the back surface of the substrate may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle substrate, e.g., a single crystal silicon handle wafer, refers to the major surface of the substrate that becomes an interior surface of the bonded structure. It is upon this front surface that the charge trapping layer is formed. Additionally, the single crystal semiconductor handle substrate may be considered as having a front surface region having a depth, D, as measured from the front surface of the handle substrate and toward the central plane. The length of D defines the depth of the porous composite layer region 44 formed according to the method of the present invention. The depth, D, may vary between about 0.1 micrometer and about 50 micrometers, such as between about 0.3 micrometer and about 20 micrometers, such as between about 1 micrometer and about 10 micrometers, such as between about 1 micrometer and about 5 micrometers, as measured from the front surface of the single crystal semiconductor handle substrate toward the central plane. A "back surface" of a single crystal semiconductor handle substrate, e.g., a handle wafer, refers to the major surface that becomes an exterior surface of the bonded structure. Similarly, a "front surface" of a single crystal semiconductor donor substrate, e.g., a single crystal silicon donor wafer, refers to the major surface of the single crystal semiconductor donor substrate that becomes an interior surface of the bonded structure. The front surface of a single crystal semiconductor donor substrate often comprises a dielectric layer 46 comprising one or more insulating layers. The dielectric layer 46 may comprise a silicon dioxide layer, which forms the buried oxide (BOX) layer in the final structure 40. A "back surface" of a single crystal semiconductor donor substrate, e.g., a single crystal silicon donor wafer, refers to the major surface that becomes an exterior surface of the bonded structure. Upon completion of conventional bonding and wafer thinning steps, the single crystal semiconductor donor substrate forms the semiconductor device layer 48 of the semiconductor-on-insulator (e.g., silicon-on-insulator) composite structure 40.

The single crystal semiconductor handle substrate and the single crystal semiconductor donor substrate may be single crystal semiconductor wafers. In preferred embodiments, the semiconductor wafers comprise a semiconductor material selected from the group consisting of silicon, silicon carbide, silicon germanium, gallium arsenide, gallium nitride, indium phosphide, indium gallium arsenide, germanium, and combinations thereof. The single crystal semiconductor wafers, e.g., the single crystal silicon handle wafer and single crystal silicon donor wafer, of the present invention typically have a nominal diameter of at least about 150 mm, at least about 200 mm, at least about 300 mm, or at least about 450 mm. Wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers.

In some embodiments, the single crystal semiconductor handle substrate and the single crystal semiconductor donor substrate, i.e., single crystal semiconductor handle wafer and single crystal semiconductor donor wafer, comprise interstitial oxygen in concentrations that are generally achieved by the Czochralski-growth method. In some embodiments, the semiconductor wafers comprise oxygen in a concentration between about 4 PPMA and about 18 PPMA. In some embodiments, the semiconductor wafers comprise oxygen in a concentration between about 10 PPMA and about 35 PPMA. Preferably, the single crystal silicon handle wafer comprises oxygen in a concentration of no greater than about 10 ppma. Interstitial oxygen may be measured according to SEMI MF 1188-1105.

The single crystal semiconductor handle substrate may have any resistivity obtainable by the Czochralski or float zone methods. In some embodiments, the single crystal semiconductor handle substrate has a relatively low minimum bulk resistivity, such as below about 100 ohm-cm, below about 50 ohm-cm, below about 1 ohm-cm, below about 0.1 ohm-cm, or even below about 0.01 ohm-cm. In some embodiments, the single crystal semiconductor handle substrate has a relatively low minimum bulk resistivity, such as below about 100 ohm-cm, or between about 1 ohm-cm and about 100 ohm-cm. Low resistivity wafers may comprise electrically active dopants, such as boron (p type), gallium (p type), phosphorus (n type), antimony (n type), and arsenic (n type).

In some embodiments, the single crystal semiconductor handle substrate has a relatively high minimum bulk resistivity. High resistivity wafers are generally sliced from single crystal ingots grown by the Czochralski method or float zone method. High resistivity wafers may comprise electrically active dopants, such as boron (p type), gallium (p type), aluminum (p type), indium (p type), phosphorus (n type), antimony (n type), and arsenic (n type), in generally very low concentrations. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 100 Ohm-cm, at least about 500 Ohm-cm, at least about 1000 Ohm-cm, or even at least about 3000 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 5,000 Ohm-cm. In some embodiments, the high resistivity single crystal semiconductor handle substrate may comprise a p type dopant, such as boron, gallium, aluminum, or indium. In some embodiments, the high resistivity single crystal semiconductor handle substrate may comprise a n type dopant, such as phosphorus, antimony, or arsenic. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

In some embodiments, the single crystal semiconductor handle wafer surface could be intentionally damaged by an abrasive blasting process or by a caustic etch.

Due to use of a high resistivity semiconductor, e.g., high resistivity silicon, as the handle substrate material, in some embodiments, a p-type dopant may be implanted into a region on the backside of the handle substrate prior to the formation of porous silicon to promote the formation of holes necessary for the formation of porous silicon. This can be accomplished by implanting dopants, such as boron, a shallow depth on the backside of the wafer and subjecting the wafer to an implant anneal. The depth of the implant is sufficiently shallow and the thickness of the wafer sufficiently large that over the course of thermal processing of the multilayer semiconductor-on-insulator structure, e.g., silicon on insulator, in the device fabrication line that the dopant does not diffuse close enough to the charge trapping layer interface to lower the resistivity of the silicon in that region, which is necessary for good RF performance.

For very high resistivity n-type handle substrates, backside illumination may be required to produce holes for the formation of porous silicon. In some embodiments, low doped n-type wafers are used in this application, and illumination from backside can be advantageously used to control the average porous diameter. Without the illumination, the pores might have excessive diameter above 100 nm. For n-type doped silicon, both pore size and inter-pore spacing can be lowered to about 5 nm, and the pore network typically looks very homogeneous and interconnected. With increasing illumination, pore sizes and inter-pore spacing increase, while the specific surface area decreases. The structure becomes anisotropic, with long voids running perpendicular to the surface.

In some embodiments, the front surface of the semiconductor handle wafer is treated to form a porous layer. The porous layer may be formed by contacting the front surface of a single crystal semiconductor handle substrate with an etching solution. In some embodiments, the etching solution comprises an aqueous hydrofluoric acid solution. Alcohols, such as ethyl alcohol or isopropyl alcohol, and surfactants, such as sodium dodecyl sulfate and CTEC, may be added. As porous silicon (p-Si) is produced at the anode of the cell, hydrogen gas bubbled are produced. These bubbles adhere to the surface of the growing p-Si surface. These bubbles act as masks, blocking the current flow and access of HF. Alcohols, such as ethyl alcohol or isopropyl alcohol, and surfactants, such as sodium dodecyl sulfate and CTEC, help to reduce this effect. Typical electrolyte can be 1:1:1 (HF:water:alcohol), other examples are 3:1 (HF:alcohol). In some embodiments, the handle wafer is etched in a hydrofluoric acid solution electrochemically, e.g., in a Teflon cell. One such commercially available cell is the wet etching double cell for porous silicon etching available from AMMT GmbH. Electrochemical etching occurs at conditions sufficient to etch pores into a front surface region of the single crystal semiconductor handle substrate. The properties of porous silicon, such as porosity, thickness, pore diameter and microstructure, depend on anodization conditions. These conditions include HF concentration, current density, wafer type and resistivity, anodization duration, illumination, temperature, and drying conditions. Choosing proper conditions to get a desired porosity and pore size is described in previous art, for example "Porous silicon: a quantum sponge structure for silicon based optoelectronics" by O. Bisi, S. Ossicini, L. Pavesi, Surface Science Reports, vol. 38 (2000) pp. 1-126. In some embodiments, the current density may range between about 5 $mA/cm^2$ and about 800 $mA/cm^2$. In some embodiments, the etching duration may be between about 1 minute to about 30 minutes. The bath temperature is typically maintained at room temperature.

The porosity, i.e., pore density, generally increases as the current density increases. Additionally, for a fixed current density, the porosity decreases with increasing HF concentration. With fixed HF concentration and current density, the porosity increases with thickness and porosity gradients in depth occur. This happens because of the extra chemical dissolution of porous silicon layer in HF. The thicker the layer, the longer the anodization time, and the longer the residence of Si in the HF reaches solutions, the higher the mass of chemically dissolved porous silicon. This effect is much more important for lightly doped Si, while it is almost negligible for heavily doped Si, because of the lower specific surface area.

Figure 4A:
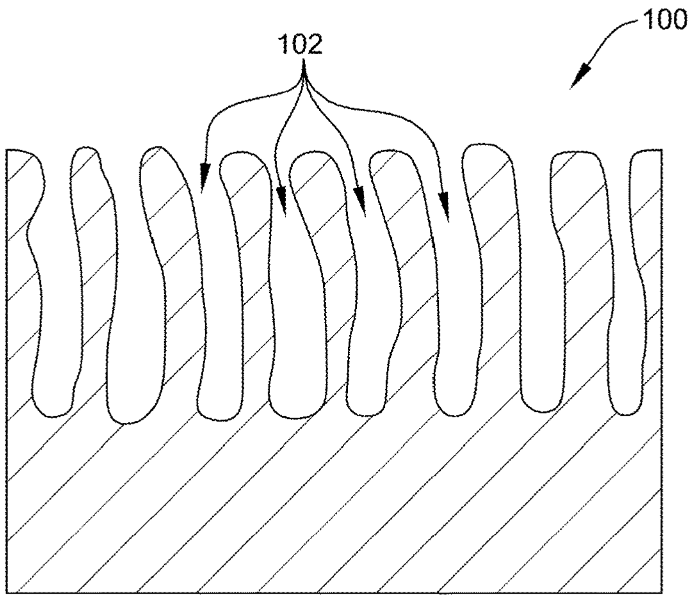
FIGS. 4A through 4C depict the process of preparing a semiconductor-on-insulator structure according to the present invention.

The front surface region may be etched to an average depth between about 0.1 micrometer and about 50 micrometers, such as between about 0.3 micrometer and about 20 micrometers, such as between about 1 micrometer and about 10 micrometers, such as between about 1 micrometer and about 5 micrometers, as measured from the front surface of the single crystal semiconductor handle substrate toward the bottom surfaces of the pores. Each of the pores is approximately tubular or cylindrical in shape, such as the pores comprise a bottom surface and a sidewall surface. The pore shape may vary significantly from pore to pore. See FIG. 4A for a depiction of a front surface region of a single crystal semiconductor handle substrate 100 comprising several pores 102. This figure depicts macroporous silicong. Pores with approximately cylindrical may be considered as having an average diameter between about 1 nanometer and about 1000 nanometers, such as between about 2 nanometer and about 200 nanometers, as measured at any point along the pore sidewall. In some embodiments, the front surface region may be characterized by a pore density, i.e., the total volume of pores as a percentage of the total volume of the front surface region between about 5% and about 80%, such as between about 5% and about 50%. In some embodiments, the front surface region may be characterized by a pore density, i.e., the total volume of pores as a percentage of the total volume of the front surface region between about 5% and about 35%, such as between about 5% and about 25%. In one specific embodiment, a wafer may be electrochemically etched in a solution of 50% ethanol/50% hydrofluoric acid (48 wt %) with current density 20 $mA/cm^2$ and rinsed afterward in deionized water. The etching time ranges from 1 to 20 min, thus resulting in layer thicknesses between about 0.3 to 1.5 microns. The films typically show deep black color. Other electrolyte compositions can be properly chosen by one skilled in the art as described in the above cited reviews.

In some embodiments, the single crystal semiconductor handle substrate comprising a porous layer in the front surface region thereof may be subjected to drying in an oxygen containing ambient atmosphere. The drying operation is optionally preceded by a wet clean and a rinse, and optionally may be rinsed and cleaned multiple times. In some embodiments, the handle substrates are subjected to rinsing, followed by transfer to wet cleaning and rinsing station, rinsed with deionized water, then dried in an oxygen containing ambient atmosphere, such as air or purified oxygen. Upon drying, the entire sidewall surfaces of the pores get oxidized ending up with so called native oxide, which is about 1 nm in thickness. If drying/oxidation is performed at room temperature, it typically takes some time, e.g., up to an hour, as after the hydrofluoric bath the surface is hydrophobic being terminated by hydrogen. Further hydrogen gradually desorbs from the surface, allowing it to oxidize. The cleaning can be also performed in wet cleaning solutions used in semiconductor industry as RCA-clean, Piranha clean, or cleaning in ozonated water. In this case, a chemical oxide is formed on pore wall surfaces, which is typically thicker than the native oxide, up to few nanometers.

In some embodiments, the native oxide layer may be further oxidized to form a thicker oxide layer. This may be accomplished by means known in the art, such as thermal oxidation (in which some portion of the exposed semiconductor material will be consumed), CVD oxide deposition, or plasma oxide deposition.

In some embodiments, the single crystal semiconductor handle substrate, e.g., a single crystal silicon handle wafer, comprising pores may be thermally oxidized in a furnace such as an ASM A400. The temperature may range from 750° C. to 1200° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In an exemplary embodiment, semiconductor handle wafers may be loaded into a vertical furnace, such as an A400. The temperature is ramped to the oxidizing temperature with a mixture of $N_2$ and $O_2$. After the desired oxide thickness has been obtained, the $O_2$ is turned off and the furnace temperature is reduced and wafers are unloaded from the furnace. Thermal oxidation can be used to fill porous films with low porosity with semiconductor oxide, e.g., silicon dioxide.

Thermal oxidizing of highly porous films is not desirable, as it might result in breakage of silicon walls between neighboring pores thus lowering yield. Plasma oxidation can be used resulting in thicknesses of silicon dioxide film on the sidewalls of the pores from 10 to 20 nm, depending on plasma conditions as frequency and power. Plasma oxidation consists of producing an oxygen plasma in a closed chamber (typically under vacuum). The plasma can be produced by microwave, r.f (radio frequency), or d.c. (direct current) plasma generator. This may also be called plasma-enhanced chemical vapor deposition reactor (PECVD reactor).

In some embodiments, an oxide film on the porous silicon may be produced by anodic oxidation (typically referred to as anodization (for example anodization of aluminum)). This is done using the same porous silicon electrochemical cell. However, the electrolyte is changed to dilute sulfuric acid (concentrated sulfuric acid is used for aluminum anodization). For porous silicon, the literature suggests the use of 1M $H_2SO_4$. If the current is very high, arcing may occur. Oxidizing of the surfaces of the sidewall and bottom of the pores under high current in oxidizing electrolytes, such as sulfuric acid, is referred to as plasma electrolytic oxidation. However, the current is direct current, and there is no frequency.

In some embodiments wherein the front surface region comprises relatively low porosity, such as between about 5% and about 25% pore density, thermal oxidation may be performed to fill the entire pore with semiconductor oxide, e.g., silicon dioxide. The surface of the thus prepared wafer is conditioned to enable wafer bonding, as described below, and pore filling with semiconductor material is not required. Further layer transfer is performed resulting in SOI wafer. This wafer also have additional $4^{th}$ layer which serves as parasitic suppressor if RF chips are made on these wafers. This parasitic suppressor film does not have high density of traps, but it is still efficient in RF parasitics suppression as it has very high resistivity, i.e., semi-insulating properties.

Figure 4B:
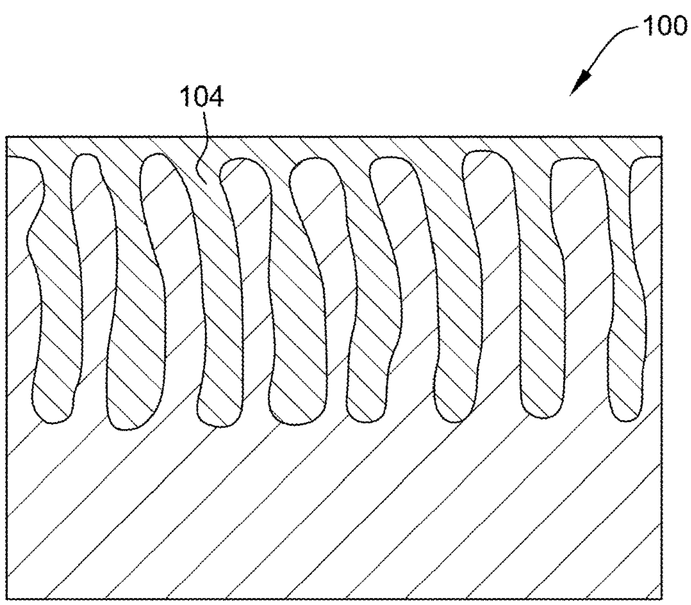

According to some embodiments of the method of the present invention, semiconductor material is deposited into the pores formed in the front surface region of the single crystal semiconductor handle wafer. See FIG. 4B depicting a single crystal semiconductor handle substrate 100 comprising pores that are filled with semiconductor material 104. The surfaces of the pores, e.g., sidewall and bottom surfaces, may comprise a native oxide layer or may be additionally oxidized by thermal or plasma oxidation. Semiconductor material suitable for filling the pores is optionally of the same composition as the high resistivity single crystal semiconductor handle substrate. Such semiconductor material may be selected from the group consisting of silicon, silicon carbide, silicon germanium, gallium arsenide, gallium nitride, indium phosphide, indium gallium arsenide, germanium, and combinations thereof. Such materials include polycrystalline semiconductor materials and amorphous semiconductor materials. In some embodiments, the materials that may be polycrystalline or amorphous include silicon (Si), silicon germanium (SiGe), silicon carbide (SiC), and germanium (Ge). Polycrystalline material, e.g., polycrystalline silicon, denotes a material comprising small silicon crystals having random crystal orientations. Polycrystalline silicon grains may be as small in size as about 20 nanometers. According to the method of the present invention, the smaller the crystal grain size of polycrystalline silicon deposited the higher the defectivity in the charge trapping layer. Amorphous silicon comprises a non-crystalline allotropic form of silicon, which lacks short range and long range order. Silicon grains having crystallinity over no more than about 10 nanometers may also be considered essentially amorphous. Silicon germanium comprises an alloy of silicon germanium in any molar ratio of silicon and germanium. Silicon carbide comprises a compound of silicon and carbon, which may vary in molar ratio of silicon and carbon. Preferably, the charge trapping layer comprising the filled pores has a resistivity at least about 1000 Ohm-cm, or at least about 3000 Ohm-cm, such as between about 1000 Ohm-cm and about 100,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 5,000 Ohm-cm.

The material for filling in the pores in the front surface region of the single crystal semiconductor handle wafer may be deposited by means known in the art. For example, the semiconductor material may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). Silicon precursors for LPCVD or PECVD include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. For example, polycrystalline silicon may be deposited onto the surface oxidation layer by pyrolyzing silane ($SiH_4$) in a temperature range between about 550° C. and about 690° C., such as between about 580° C. and about 650° C. The chamber pressure may range from about 70 to about 400 mTorr. Amorphous silicon may be deposited by plasma enhanced chemical vapor deposition (PECVD) at temperatures generally ranging between about 75° C. and about 300° C. Silicon germanium, particularly amorphous silicon germanium, may be deposited at temperatures up to about 300° C. by chemical vapor deposition by including organogermanium compounds, such as isobutylgermane, alkylgermanium trichlorides, and dimethylaminogermanium trichloride. Silicon carbide may be deposited by thermal plasma chemical vapor deposition in epitaxial reactors using precursors such as silicon tetrachloride and methane. Suitable carbon precursors for CVD or PECVD include methylsilane, methane, ethane, ethylene, among others. For LPCVD deposition, methylsilane is a particularly preferred precursor since it provides both carbon and silicon. For PECVD deposition, the preferred precursors include silane and methane. In some embodiments, the silicon layer may comprise a carbon concentration of at least about 1% on an atomic basis, such as between about 1% and about 10%.

The overall thickness of the charge trapping layer comprising the filled pores is dictated by the etching process, as described above. Accordingly, the front surface region of the single crystal semiconductor substrate may comprise a charge trapping layer comprising filled pores having an average depth between about 0.1 micrometer and about 50 micrometers, such as between about 0.3 micrometer and about 20 micrometers, such as between about 1 micrometer and about 10 micrometers, such as between about 1 micrometer and about 5 micrometers, as measured from the front surface of the single crystal semiconductor handle substrate toward the bottom surfaces of the pores.

The pore filling step serves to achieve several goals. One goal is to enable further layer transfer. That is, layer transfer onto a porous surface is not desired as it will be difficult to perform wafer bonding to it. Also, when bonded this wafer should serve as a stiffener thus enabling cleavage in the donor wafer and eventual layer transfer and final SOI wafer. Another goal is to create a layer which does not evolve upon further high temperature annealing steps in SOI wafer finishing and in semiconductor device fabrication.

Figure 4C:
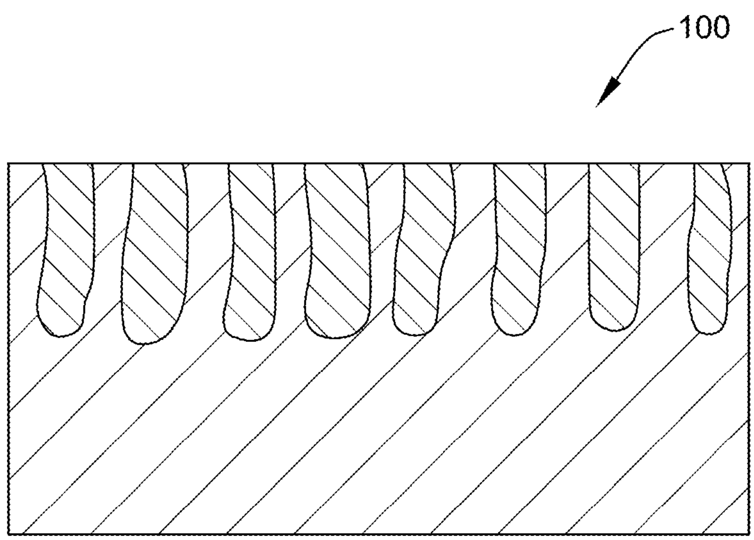

After pore filling, the single crystal semiconductor handle substrate comprising the filled pores may be subjected to chemical mechanical polishing ("CMP"). Chemical mechanical polishing may occur by methods known in the art. See FIG. 4C, which depicts a single crystal semiconductor handle substrate 100 subjected to CMP polishing over the wafer surface. The purposes of this step are (1) to lower surface roughness to level when it can be bondable to the donor wafer, and (2) to remove non-interrupted portion of polycrystalline silicon film, as the non-interrupted portion does not have desired thermal stability.

According to the method of the present invention, the front surface of the handle substrate comprising filled pores may be oxidized after CMP. In some embodiments, the front surface may be thermally oxidized (in which some portion of the deposited semiconductor material film will be consumed) or the semiconductor oxide (e.g., silicon dioxide) film may be grown by CVD oxide deposition. The oxide layer may have a thickness between about 0.1 micrometer and about 10 micrometers, such as between about 0.1 micrometers and about 4 micrometers, such as between about 0.1 micrometers and about 2 micrometers, or between about 0.1 micrometers and about 1 micrometer.

After the steps described above, wafer cleaning is optional. If desired, the wafers can be cleaned, for example, in a standard SC1/SC2 solution. Additionally, the wafers, particularly, the silicon dioxide layer on the charge trapping layer, may be subjected to chemical mechanical polishing (CMP) to reduce the surface roughness, preferably to the level of $RMS_{2\times2\ micrometer}{}^2$ is less than about 5 angstroms, wherein root mean squared—

$$R_q = \sqrt{\frac{1}{n}\sum_{i=1}^{n} y_i^2},$$

the roughness profile contains ordered, equally spaced points along the trace, and $y_i$ is the vertical distance from the mean line to the data point.

The single crystal semiconductor handle wafer prepared according to the method described herein to comprise a charge trapping layer is next bonded a single crystal semiconductor donor substrate, e.g., a single crystal semiconductor donor wafer, which is prepared according to conventional layer transfer methods. The single crystal semiconductor donor substrate may be a single crystal semiconductor wafer. In preferred embodiments, the semiconductor wafer comprises a semiconductor material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the single crystal semiconductor (e.g., silicon) donor wafer may comprise a dopant selected from the group consisting of boron, arsenic, and phosphorus. The resistivity of the single crystal semiconductor (e.g., silicon) donor wafer may range from 1 to 50 Ohm-cm, typically, from 5 to 25 Ohm-cm. The single crystal semiconductor donor wafer may be subjected to standard process steps including oxidation, implant, and post implant cleaning. Accordingly, a semiconductor donor substrate, such as a single crystal semiconductor wafer of a material that is conventionally used in preparation of multilayer semiconductor structures, e.g., a single crystal silicon donor wafer, that has been etched and polished and optionally oxidized, is subjected to ion implantation to form a damage layer in the donor substrate. The damage layer forms the eventually cleave plane.

In some embodiments, the semiconductor donor substrate comprises a dielectric layer, i.e., an insulating layer. Suitable dielectric layers may comprise a material selected from among silicon dioxide, silicon nitride, silicon oxynitride, hafnium oxide, titanium oxide, zirconium oxide, lanthanum oxide, barium oxide, and a combination thereof. In some embodiments, the dielectric layer has a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers.

In some embodiments, the dielectric layer comprises one or more insulating material selected from the group consisting of silicon dioxide, silicon nitride, silicon oxynitride, and any combination thereof. In some embodiments, the dielectric layer has a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers.

In some embodiments, the dielectric layer comprises multiple layers of insulating material. The dielectric layer may comprise two insulating layers, three insulating layers, or more. Each insulating layer may comprise a material selected from among silicon dioxide, silicon oxynitride, silicon nitride, hafnium oxide, titanium oxide, zirconium oxide, lanthanum oxide, barium oxide, and any combination thereof. In some embodiments, each insulating layer may comprise a material selected from the group consisting of silicon dioxide, silicon nitride, siliconoxynitride, and any combination thereof. Each insulating layer may have a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers.

In some embodiments, the front surface of the single crystal semiconductor donor substrate (e.g., a single crystal silicon donor substrate) may be thermally oxidized (in which some portion of the deposited semiconductor material film will be consumed) to prepare the semiconductor oxide film, or the semiconductor oxide (e.g., silicon dioxide) film may be grown by CVD oxide deposition. In some embodiments, the front surface of the single crystal semiconductor donor substrate may be thermally oxidized in a furnace such as an ASM A400 in the same manner described above. In some embodiments, the donor substrates are oxidized to provide an oxide layer on the front surface layer of at least about 10 nanometer thick, such as between about 10 nanometers and about 10,000 nanometers, between about 10 nanometers and about 5,000 nanometers, or between about 100 nanometers and about 800 nanometers, such as about 600 nanometers.

Ion implantation may be carried out in a commercially available instrument such as an Applied Materials Quantum II, a Quantum LEAP, or a Quantum X. Implanted ions include He, H, H2, or combinations thereof. Ion implantation is carried out as a density and duration sufficient to form a damage layer in the semiconductor donor substrate. Implant density may range from about 1012 ions/cm2 to about 1017 ions/cm2, such as from about 1014 ions/cm2 to about 1017 ions/cm2, such as from about 1015 ions/cm2 to about 1016 ions/cm2. Implant energies may range from about 1 keV to about 3,000 keV, such as from about 5 keV to about 1,000 keV, or from about 5 keV to about 200 keV, or from 5 keV to about 100 keV, or from 5 keV to about 80 keV. The depth of implantation determines the thickness of the single crystal semiconductor device layer in the final SOI structure. In some embodiments it may be desirable to subject the single crystal semiconductor donor wafers, e.g., single crystal silicon donor wafers, to a clean after the implant. In some preferred embodiments, the clean could include a Piranha clean followed by a DI water rinse and SC1/SC2 cleans.

In some embodiments of the present invention, the single crystal semiconductor donor substrate having an ion implant region therein formed by helium ion and/or hydrogen ion implant is annealed at a temperature sufficient to form a thermally activated cleave plane in the single crystal semiconductor donor substrate. An example of a suitable tool might be a simple Box furnace, such as a Blue M model. In some preferred embodiments, the ion implanted single crystal semiconductor donor substrate is annealed at a temperature of from about 200° C. to about 350° C., from about 225° C. to about 350° C., preferably about 350° C. Thermal annealing may occur for a duration of from about 2 hours to about 10 hours, such as from about 2 hours to about 2 hours. Thermal annealing within these temperatures ranges is sufficient to form a thermally activated cleave plane. After the thermal anneal to activate the cleave plane, the single crystal semiconductor donor substrate surface is preferably cleaned.

In some embodiments, the ion-implanted and optionally cleaned and optionally annealed single crystal semiconductor donor substrate is subjected to oxygen plasma and/or nitrogen plasma surface activation. In some embodiments, the oxygen plasma surface activation tool is a commercially available tool, such as those available from EV Group, such as EVG®810LT Low Temp Plasma Activation System. The ion-implanted and optionally cleaned single crystal semiconductor donor wafer is loaded into the chamber. The chamber is evacuated and backfilled with $O_2$ or $N_2$ to a pressure less than atmospheric to thereby create the plasma. The single crystal semiconductor donor wafer is exposed to this plasma for the desired time, which may range from about 1 second to about 120 seconds. Oxygen or nitrogen plasma surface oxidation is performed in order to render the front surface of the single crystal semiconductor donor substrate hydrophilic and amenable to bonding to a single crystal semiconductor handle substrate prepared according to the method described above. After plasma activation, the activated surface is rinsed with deionized water. The wafer is then spun dry prior to bonding.

The hydrophilic front surface layer of the single crystal semiconductor donor substrate and the front surface of the single crystal semiconductor handle substrate, which is optionally oxidized, are next brought into intimate contact to thereby form a bonded structure. The bonded structure comprises a dielectric layer, e.g., a buried oxide, with a portion of the dielectric layer contributed by the oxidized front surface of the single crystal semiconductor handle substrate and a portion of the dielectric layer contributed by the oxidized front surface of the single crystal semiconductor donor substrate. In some embodiments, the dielectric layer, e.g., buried oxide layer, has a thickness of at least about 10 nanometer thick, such as between about 10 nanometers and about 10,000 nanometers, between about 10 nanometers and about 5,000 nanometers, or between about 100 nanometers and about 800 nanometers, such as about 600 nanometers.

Since the mechanical bond is relatively weak due to being held together by van der Waal's forces, the bonded structure is further annealed to solidify the bond between the donor wafer and the handle wafer. In some embodiments of the present invention, the bonded structure is annealed at a temperature sufficient to form a thermally activated cleave plane in the single crystal semiconductor donor substrate. An example of a suitable tool might be a simple Box furnace, such as a Blue M model. In some preferred embodiments, the bonded structure is annealed at a temperature of from about 200° C. to about 350° C., from about 225° C. to about 350° C., preferably about 350° C. Thermal annealing may occur for a duration of from about 0.5 hours to about 10 hour, preferably a duration of about 2 hours. Thermal annealing within these temperatures ranges is sufficient to form a thermally activated cleave plane. After the thermal anneal to activate the cleave plane, the bonded structure may be cleaved.

After the thermal anneal, the bond between the single crystal semiconductor donor substrate and the single crystal semiconductor handle substrate is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the semiconductor donor wafer, thereby leaving a semiconductor device layer, preferably a silicon device layer, on the semiconductor-on-insulator composite structure.

After cleaving, the cleaved structure may be subjected to a high temperature anneal in order to further strengthen the bond between the transferred device layer and the single crystal semiconductor handle substrate. An example of a suitable tool might be a vertical furnace, such as an ASM A400. In some preferred embodiments, the bonded structure is annealed at a temperature of from about 1000° C. to about 1200° C., preferably at about 1000° C. Thermal annealing may occur for a duration of from about 0.5 hours to about 8 hours; preferably a duration of about 2 to 4 hours. Thermal annealing within these temperatures ranges is sufficient to strengthen the bond between the transferred device layer and the single crystal semiconductor handle substrate.

After the cleave and high temperature anneal, the bonded structure may be subjected to a cleaning process designed to remove thin thermal oxide and clean particulates from the surface. In some embodiments, the single crystal semiconductor donor wafer may be brought to the desired thickness and smoothness by subjecting to a vapor phase HCl etch process in a horizontal flow single wafer epitaxial reactor using H2 as a carrier gas. In some embodiments, an epitaxial layer may be deposited on the transferred device layer. The finished SOI wafer comprises the high resistivity single crystal semiconductor handle substrate (e.g., a single crystal silicon handle substrate), a charge trapping layer, a dielectric layer (e.g., buried oxide layer) prepared from oxidation of the single crystal semiconductor donor substrate, and the semiconductor device layer (prepared by thinning the donor substrate), may then be subjected to end of line metrology inspections and cleaned a final time using typical SC1-SC2 process.

Radiofrequency chips of enhanced quality can be fabricated from this SOI wafer. The distributed oxide walls in the porous silicon prevent grain growth upon the polycrystalline silicon annealing. Consequently, the parasitic-suppressor film keeps high area of grain boundaries, and therefore high density of charge traps. Eventually, in the RF chips, the parasitic conductive channels are not induced, even if high temperature processing steps are used in the RF chip fabrication.

Having described the invention in detail, it will be apparent that modifications and variations are possible without departing from the scope of the invention defined in the appended claims.

As various changes could be made in the above compositions and processes without departing from the scope of the invention, it is intended that all matter contained in the above description be interpreted as illustrative and not in a limiting sense.

When introducing elements of the present invention or the preferred embodiment(s) thereof, the articles "a," "an," "the," and "said" are intended to mean that there are one or more of the elements. The terms "comprising," "including," and "having" are intended to be inclusive and mean that there may be additional elements other than the listed elements.

What is claimed is:

1. A multilayer structure comprising:

a single crystal semiconductor handle substrate comprising two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, a front surface region having a depth, D, as measured from the front surface and toward the central plane, and a bulk region between the front and back surfaces of the single crystal semiconductor handle substrate, wherein the front surface region comprises pores, each of the pores comprising a bottom surface and a sidewall surface, and further wherein the pores are filled with an amorphous semiconductor material, a polycrystalline semiconductor material, or a semiconductor oxide;

a dielectric layer in contact with the front surface of the single crystal semiconductor handle substrate; and a single crystal semiconductor device layer in contact with the dielectric layer.

2. The multilayer structure of claim 1 wherein the single crystal semiconductor handle substrate comprises silicon.

3. The multilayer structure of claim 1 wherein the single crystal semiconductor handle substrate comprises a silicon wafer sliced from a single crystal silicon ingot grown by the Czochralski method or the float zone method.

4. The multilayer structure of claim 1 wherein the single crystal semiconductor device layer comprises single crystal silicon.

5. The multilayer structure of claim 1 wherein the single crystal semiconductor device layer comprises a single crystal silicon wafer sliced from a single crystal silicon ingot grown by the Czochralski method or the float zone method.

6. The multilayer structure of claim 1 wherein the single crystal semiconductor handle substrate has a bulk resistivity between about 500 Ohm-cm and about 100,000 Ohm-cm.

7. The multilayer structure of claim 1 wherein the single crystal semiconductor handle substrate has a bulk resistivity between about 1000 Ohm-cm and about 100,000 Ohm-cm.

8. The multilayer structure of claim 1 wherein the single crystal semiconductor handle substrate has a bulk resistivity between about 1000 ohm cm and about 10,000 Ohm-cm.

9. The multilayer structure of claim 1 wherein the single crystal semiconductor handle substrate has a bulk resistivity between about 2000 Ohm cm and about 10,000 Ohm-cm.

10. The multilayer structure of claim 1 wherein the single crystal semiconductor handle substrate has a bulk resistivity between about 3000 Ohm-cm and about 10,000 Ohm-cm.

11. The multilayer structure of claim 1 wherein the single crystal semiconductor handle substrate has a bulk resistivity between about 3000 Ohm cm and about 5,000 Ohm-cm.

12. The multilayer structure of claim 1 wherein the front surface region of the single crystal semiconductor handle substrate has a depth, D, between about 0.1 micrometer and about 50 micrometers.

13. The multilayer structure of claim 1 wherein the front surface region of the single crystal semiconductor handle substrate has a depth, D, between about 0.3 micrometer and about 20 micrometers, between about 1 micrometer and about 10 micrometers, or between about 1 micrometer and about 5 micrometers, as measured from the front surface of the single crystal semiconductor handle substrate toward the bottom surfaces of the pores.

14. The multilayer structure of claim 1 wherein the front surface region of the single crystal semiconductor handle substrate comprises pores at a pore density between about 5% and about 80%.

15. The multilayer structure of claim 1 wherein the front surface region of the single crystal semiconductor handle substrate comprises pores at a pore density between about 5% and about 50%.

16. The multilayer structure of claim 1 wherein the pores have an average depth between about 1 micrometer and about 10 micrometers, as measured from the front surface of the single crystal semiconductor handle substrate toward the bottom surfaces of the pores.

17. The multilayer structure of claim 1 wherein the pores have an average depth between about 1 micrometer and about 5 micrometers, as measured from the front surface of the single crystal semiconductor handle substrate toward the bottom surfaces of the pores.

18. The multilayer structure of claim 1 wherein the pores have an average diameter between about 1 nanometer and about 1000 nanometers, as measured at any point along the pore sidewall.

19. The multilayer structure of claim 1 wherein the pores have an average diameter between about 2 nanometer and about 200 nanometers, as measured at any point along the pore sidewall.

20. The multilayer structure of claim 1 wherein the bottom surface and sidewall surface of each of the pores comprise a semiconductor oxide film.

21. The multilayer structure of claim 1 wherein the pores are filled with amorphous semiconductor material.

22. The multilayer structure of claim 1 wherein the pores are filled with amorphous silicon.

23. The multilayer structure of claim 1 wherein the pores are filled with polycrystalline semiconductor material.

24. The multilayer structure of claim 1 wherein the pores are filled with polycrystalline silicon.

25. The multilayer structure of claim 1 wherein the pores are filled with a semiconductor oxide.

26. The multilayer structure of claim 1 wherein the pores are filled with silicon dioxide.

27. The multilayer structure of claim 1 wherein the dielectric layer comprises a material selected from the group consisting of silicon dioxide, silicon nitride; silicon oxynitride, hafnium oxide, titanium oxide, zirconium oxide, lanthanum oxide, barium oxide, and a combination thereof.

28. The multilayer structure of claim 1 wherein the dielectric layer comprises a material selected from the group consisting of silicon dioxide, silicon oxynitride, silicon nitride, and any combination thereof.

29. The multilayer structure of claim 1 wherein the dielectric layer comprises a multilayer, each insulating layer within the multilayer comprising a material selected from the group consisting of silicon dioxide, silicon oxynitride, and silicon nitride.

30. The multilayer structure of claim 1 wherein the dielectric layer comprises a buried oxide layer having a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers.

31. The multilayer structure of claim 1 wherein the dielectric layer comprises silicon dioxide.

32. The multilayer structure of claim 31 wherein the silicon dioxide has a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers.

33. A method of forming a multilayer structure, the method comprising:

contacting a front surface of a single crystal semiconductor handle substrate with an etching solution to thereby etch pores into a front surface region of the single crystal semiconductor handle substrate, wherein the single crystal semiconductor handle substrate comprises two major, generally parallel surfaces, one of which is the front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, the front surface region having a depth, D, as measured from the front surface and toward the central plane, and a bulk region between the front and back surfaces of the single crystal semiconductor handle substrate, wherein each of the pores comprises a bottom surface and a sidewall surface;

oxidizing the bottom surface and the sidewall surface of each of the pores;

filling each of the pores having the oxidized bottom surface and the oxidized sidewall surface with amorphous semiconductor material, polycrystalline semiconductor material, or a semiconductor oxide; and bonding a dielectric layer on a front surface of a single crystal semiconductor donor substrate to the front surface of the single crystal semiconductor handle substrate to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate.

34. The method of claim 33 wherein the single crystal semiconductor handle substrate comprises silicon.

35. The method of claim 33 wherein the single crystal semiconductor handle substrate comprises a silicon wafer sliced from a single crystal silicon ingot grown by the Czochralski method or the float zone method.

36. The method of claim 33 wherein the single crystal semiconductor donor substrate comprises single crystal silicon.

37. The method of claim 33 wherein the single crystal semiconductor donor substrate comprises a single crystal silicon wafer sliced from a single crystal silicon ingot grown by the Czochralski method or the float zone method.

38. The method of claim 33 wherein the single crystal semiconductor handle substrate has a bulk resistivity between about 500 Ohm-cm and about 100,000 Ohm-cm.

39. The method of claim 33 wherein the single crystal semiconductor handle substrate has a bulk resistivity between about 1000 Ohm-cm and about 100,000 Ohm-cm.

40. The method of claim 33 wherein the single crystal semiconductor handle substrate has a bulk resistivity between about 1000 ohm cm and about 10,000 Ohm-cm.

41. The method of claim 33 wherein the single crystal semiconductor handle substrate has a bulk resistivity between about 2000 Ohm cm and about 10,000 Ohm-cm.

42. The method of claim 33 wherein the single crystal semiconductor handle substrate has a bulk resistivity between about 3000 Ohm-cm and about 10,000 Ohm-cm.

43. The method of claim 33 wherein the single crystal semiconductor handle substrate has a bulk resistivity between about 3000 Ohm cm and about 5,000 Ohm-cm.

44. The method of claim 33 wherein the front surface region of the single crystal semiconductor handle substrate is etched to a pore density between about 5% and about 80%.

45. The method of claim 33 wherein the front surface region of the single crystal semiconductor handle substrate is etched to a pore density between about 5% and about 50%.

46. The method of claim 33 wherein the front surface region of the single crystal semiconductor handle substrate is contacted with the etching solution for a duration sufficient to etch pores to an average depth between about 1 micrometer and about 10 micrometers, as measured from the front surface of the single crystal semiconductor handle substrate toward the bottom surfaces of the pores.

47. The method of claim 33 wherein the front surface region of the single crystal semiconductor handle substrate is contacted with the etching solution for a duration sufficient to etch pores to an average depth between about 1 micrometer and about 5 micrometers, as measured from the front surface of the single crystal semiconductor handle substrate toward the bottom surfaces of the pores.

48. The method of claim 33 wherein the front surface region of the single crystal semiconductor handle substrate is contacted with the etching solution for a duration sufficient to etch pores to an average diameter between about 1 nanometer and about 1000 nanometers, as measured at any point along the pore sidewall.

49. The method of claim 33 wherein the front surface region of the single crystal semiconductor handle substrate is contacted with the etching solution for a duration sufficient to etch pores to an average diameter between about 2 nanometer and about 200 nanometers, as measured at any point along the pore sidewall.

50. The method of claim 33 wherein the front surface region of the single crystal semiconductor handle substrate comprising pores is dried after etching.

51. The method of claim 33 wherein the bottom surface and sidewall surface of each of the pores are oxidized by contacting the single crystal semiconductor handle substrate comprising the pores in the front surface region thereof with an ambient atmosphere comprising oxygen.

52. The method of claim 51 wherein the ambient atmosphere comprising oxygen is air.

53. The method of claim 33 wherein the bottom surface and sidewall surface of each of the pores are oxidized by anodic oxidation.

54. The method of claim 53 wherein anodic oxidation occurs in an anodizing electrolyte comprising sulfuric acid.

55. The method of claim 33 wherein the pores are filled with amorphous semiconductor material.

56. The method of claim 33 wherein the pores are filled with amorphous silicon.

57. The method of claim 33 wherein the pores are filled with polycrystalline semiconductor material.

58. The method of claim 33 wherein the pores are filled with polycrystalline silicon.

59. The method of claim 33 wherein the pores are filled with a semiconductor oxide.

60. The method of claim 33 wherein the pores are filled with silicon dioxide.

61. The method of claim 33 further comprising heating the bonded structure at a temperature and for a duration sufficient to strengthen the bond between the dielectric layer of the semiconductor donor structure and the semiconductor oxide on the front surface of the single semiconductor handle substrate.

62. The method of claim 33 wherein the single crystal semiconductor donor substrate comprises a cleave plane.

63. The method of claim 62 further comprising mechanically cleaving the bonded structure at the cleave plane of the single crystal semiconductor donor substrate to thereby prepare a cleaved structure comprising the single crystal semiconductor handle substrate, the semiconductor oxide layer, the dielectric layer in contact with the semiconductor oxide layer, and a single crystal semiconductor device layer in contact with the dielectric layer.

64. The method of claim 63 further comprising heating the cleaved structure at a temperature and for a duration sufficient to strengthen the bond between the single crystal semiconductor device layer and the single crystal semiconductor handle substrate.

* * * * *